United States Patent
Park et al.

(10) Patent No.: US 9,799,561 B2
(45) Date of Patent: Oct. 24, 2017

(54) METHOD FOR FABRICATING A SEMICONDUCTOR DEVICE

(71) Applicant: Samsung Electronics Co., Ltd., Suwon-si (KR)

(72) Inventors: Chan-Hoon Park, Osan-si (KR); Dong-Chan Kim, Seoul (KR); Masayuki Tomoyasu, Seongnam-si (KR); Je-Woo Han, Hwaseong-si (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 15/238,836

(22) Filed: Aug. 17, 2016

(65) Prior Publication Data

US 2017/0053828 A1    Feb. 23, 2017

(30) Foreign Application Priority Data

Aug. 19, 2015  (KR) .......................... 10-2015-0116594

(51) Int. Cl.
H01L 21/338    (2006.01)
H01L 21/768    (2006.01)
(Continued)

(52) U.S. Cl.
CPC ...... H01L 21/76897 (2013.01); H01L 21/682 (2013.01); H01L 21/76805 (2013.01);
(Continued)

(58) Field of Classification Search
CPC ............ H01L 21/76897; H01L 21/682; H01L 21/76805
See application file for complete search history.

(56) References Cited

U.S. PATENT DOCUMENTS 7,700,493 B2    4/2010    Lee et al.
8,563,412 B2    10/2013   Kim et al.
(Continued)

FOREIGN PATENT DOCUMENTS

GB          2400237        10/2004
KR       2001-0058452       7/2001
(Continued)

*Primary Examiner* — Bradley K Smith
(74) *Attorney, Agent, or Firm* — Muir Patent Law, PLLC

(57) ABSTRACT

A method for fabricating a semiconductor device is disclosed. The method includes forming a first interlayer insulating layer including a first trench that is defined by a first gate spacer and a second trench that is defined by a second gate spacer on a substrate, forming a first gate electrode that fills a part of the first trench and a second gate electrode that fills a part of the second trench, forming a first capping pattern that fills the remainder of the first trench on the first gate electrode, forming a second capping pattern that fills the remainder of the second trench on the second gate electrode, forming a second interlayer insulating layer that covers the first gate spacer and the second gate spacer on the first interlayer insulating layer, forming a third interlayer insulating layer on the second interlayer insulating layer and forming a contact hole that penetrates the third interlayer insulating layer and the second interlayer insulating layer between the first gate electrode and the second gate electrode.

19 Claims, 18 Drawing Sheets

(51) Int. Cl.
    *H01L 21/66*      (2006.01)
    *H01L 21/68*      (2006.01)
    *H01L 21/8234*    (2006.01)
(52) U.S. Cl.
    CPC .............. *H01L 21/823431* (2013.01); *H01L 21/823437* (2013.01); *H01L 21/823468* (2013.01); *H01L 21/823475* (2013.01); *H01L 22/12* (2013.01)

(56) References Cited

U.S. PATENT DOCUMENTS

| | | | |
|---|---|---|---|
| 2002/0155726 A1* | 10/2002 | Ueda .................. | H01L 21/02063 438/724 |
| 2012/0252180 A1* | 10/2012 | Tomimatsu ......... | H01L 27/1104 438/299 |
| 2014/0151817 A1 | 6/2014 | Bohr et al. | |
| 2014/0210017 A1 | 7/2014 | Kim et al. | |
| 2015/0137273 A1* | 5/2015 | Zhang ................ | H01L 29/66545 257/412 |

FOREIGN PATENT DOCUMENTS

| | | |
|---|---|---|
| KR | 2001-0109369 | 12/2001 |
| KR | 2004-0085241 | 10/2004 |
| KR | 2009-0070709 | 7/2009 |
| KR | 2009-0099402 | 9/2009 |
| KR | 2009-0119228 | 11/2009 |
| KR | 2011-0003040 | 1/2011 |
| KR | 2012-0019246 | 3/2012 |

\* cited by examiner

1200

1300

1400

METHOD FOR FABRICATING A SEMICONDUCTOR DEVICE

CROSS-REFERENCE TO RELATED APPLICATIONS

This application claims priority under 35 U.S.C. §119 to Korean Patent Application No. 10-2015-0116594, filed on Aug. 19, 2015, in the Korean Intellectual Property Office, the disclosure of which is incorporated herein in its entirety by reference.

BACKGROUND

1. Field of the Disclosure

The present disclosure relates to a method for fabricating a semiconductor device.

2. Description of the Prior Art

As sizes and design rules of semiconductor devices have been reduced with high integration degrees of semiconductor devices, a gap between transistor of semiconductor devices has been decreased. Accordingly, a gap between contacts for connecting semiconductor devices to each other has also been decreased. Thus, a SAC (Self Aligned Contact) process has been proposed to form contacts having a fine pitch.

When forming SACs (Self Aligned Contacts), it may be especially important to keep an alignment state of the contacts so that the contacts may not be not short-circuited to devices that are near the contacts.

SUMMARY

Example embodiments of the present disclosure may provide a method for fabricating a semiconductor device including SACs (Self Aligned Contacts) that may prevent electrical short to peripheral devices.

Additional advantages, subjects, and features of the disclosure will be set forth in part in the description which follows and in part will become apparent to those having ordinary skill in the art upon examination of the following or may be learned from practice of the disclosure.

In one aspect of the present disclosure, a method for fabricating a semiconductor device may include forming a first interlayer insulating layer including a first trench that is defined by a first gate spacer and a second trench that is defined by a second gate spacer on a substrate, forming a first gate electrode that fills a part of the first trench and a second gate electrode that fills a part of the second trench, forming a first capping pattern that fills the remainder of the first trench on the first gate electrode, forming a second capping pattern that fills the remainder of the second trench on the second gate electrode, forming a second interlayer insulating layer that covers the first gate spacer and the second gate spacer on the first interlayer insulating layer, forming a third interlayer insulating layer on the second interlayer insulating layer and forming a contact hole that penetrates the third interlayer insulating layer and the second interlayer insulating layer between the first gate electrode and the second gate electrode.

In another aspect of the present disclosure, a method for fabricating a semiconductor device may include providing a substrate having a first region and a second region; forming a first gate spacer and a second gate spacer on the first region of the substrate; forming a third gate spacer and a fourth gate spacer on the second region of the substrate; forming a first interlayer insulating layer on the substrate, wherein the first interlayer insulating layer may include a first trench defined by the first gate spacer, a second trench defined by the second gate spacer, a third trench defined by the third gate spacer, and a fourth trench defined by the fourth gate spacer; forming a first electrode that fills a part of the first trench; forming a second electrode that fills a part of the second trench; forming a third electrode that fills a part of the third trench; forming a fourth electrode that fills a part of the fourth trench; forming a first capping pattern that fills the remainder of the first trench on the first gate electrode; forming a second capping pattern that fills the remainder of the second trench on the second gate electrode; forming a third capping pattern that fills the remainder of the third trench on the third gate electrode; forming a fourth capping pattern that fills the remainder of the fourth trench on the fourth gate electrode; forming a second interlayer insulating layer that covers the first gate spacer, the second gate spacer, the third gate spacer and the fourth gate spacer on the first interlayer insulating layer; forming a first capping layer on the first gate spacer and the second gate spacer by etching the second interlayer insulating layer; and forming a second capping layer on the third gate spacer and the fourth gate spacer by etching of the second interlayer insulating layer, wherein a width in which an upper surface of the first gate spacer and the first capping layer overlap each other is different from a width in which an upper surface of the third gate spacer and the second capping layer overlap each other.

Aspects of the present disclosure are not limited to the above-mentioned aspects, and other aspects that have not been mentioned will be clearly understood by those skilled in the art from the following description.

BRIEF DESCRIPTION OF THE DRAWINGS

The above and other objects, features and advantages of the present disclosure will be more apparent from the following detailed description taken in conjunction with the accompanying drawings, in which.

DETAILED DESCRIPTION OF THE EMBODIMENTS

Figure 1:
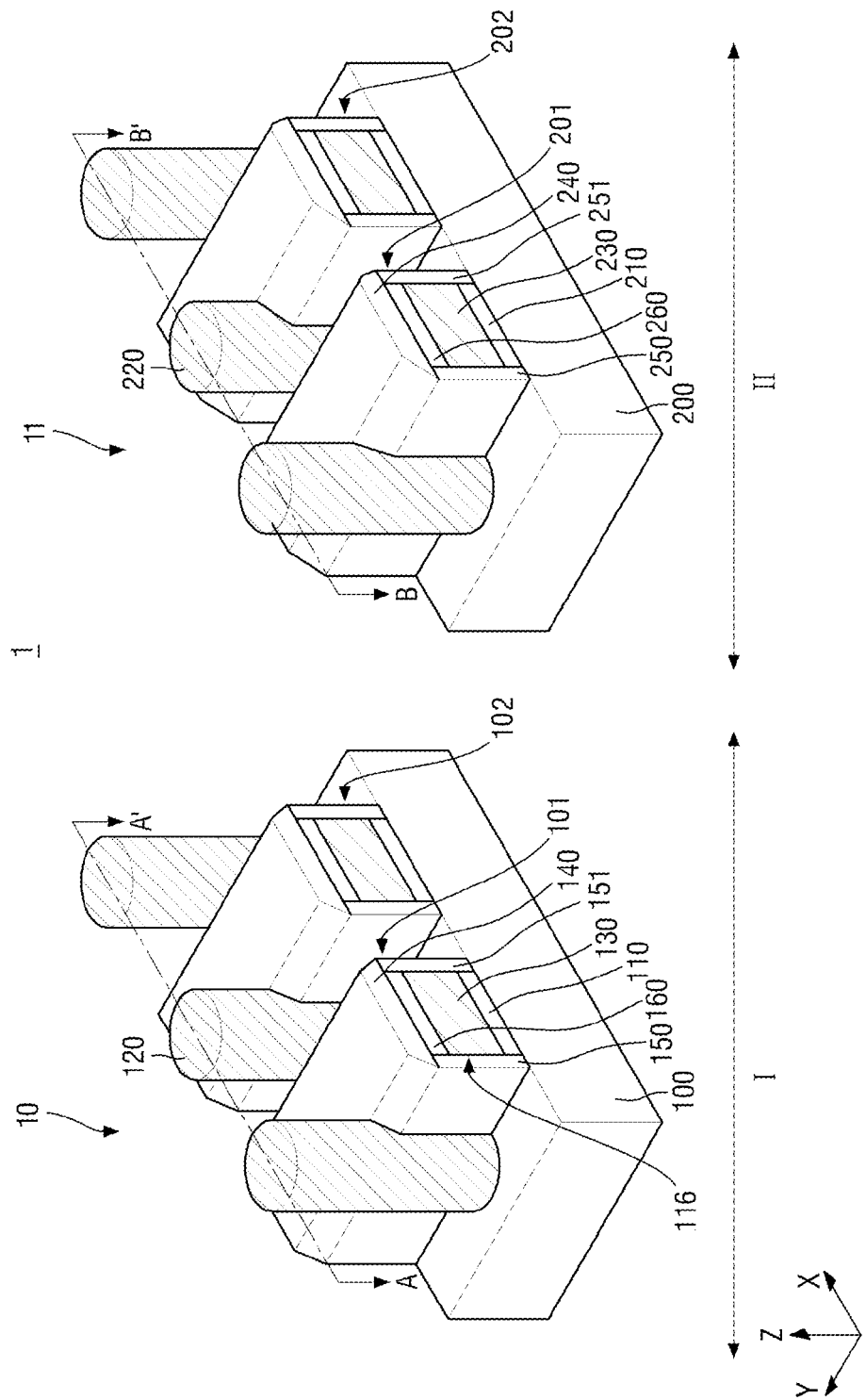
FIG. 1 is a perspective view of a semiconductor device according to an embodiment of the present disclosure.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two devices, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Hereinafter, embodiments of the present disclosure will be described with reference to the accompanying drawings.

Figure 2:
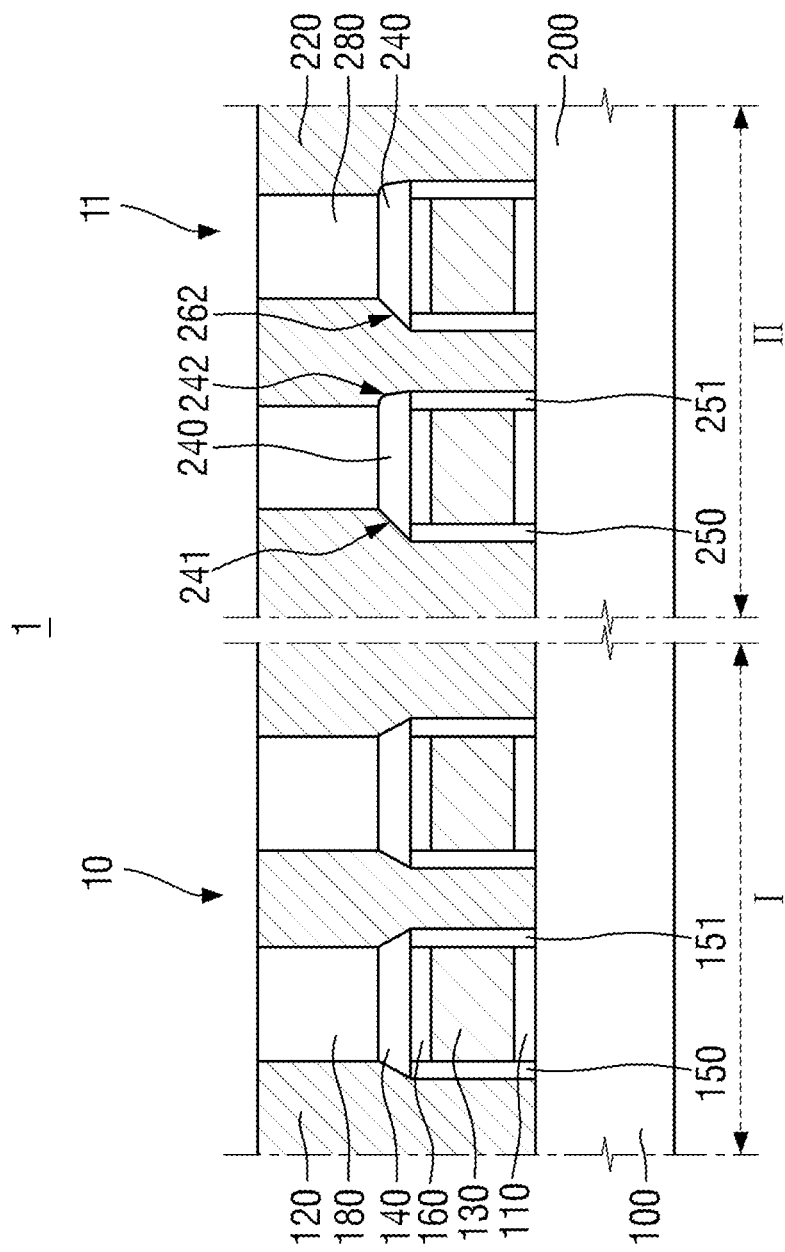
FIG. 2 is a cross-sectional view taken along lines A-A' and B-B' of FIG. 1.

FIG. 1 is a perspective view of a semiconductor device according to an embodiment of the present disclosure, and FIG. 2 is a cross-sectional view taken along lines A-A' and B-B' of FIG. 1.

As used herein, a semiconductor device may refer to any of the various devices such as shown in FIGS. 1-18, and may also refer, for example, to two transistors or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Referring to FIGS. 1 and 2, in some embodiments, a semiconductor device 1 may include a first transistor 10 that is formed in a first region I and a second transistor 11 that is formed in a second region II. The first region I and the second region II may be regions that are spaced apart from each other in some embodiments or may be regions that are connected to each other in some embodiments. The first region I may be, for example, a static random-access memory (SRAM) forming region, and the second region II may be, for example, a logic region.

The first transistor 10 may include first and second gate structures 101 and 102, respectively, on a substrate 100. The second transistor 11 may include third and fourth gate structures 201 and 202, respectively, on a substrate 200.

In some embodiments, the first and second gate structures 101 and 102 may each include a first gate insulating layer 110, a first gate electrode 130, a first capping pattern 160, and a pair of first gate spacers 150 and 151. In some embodiments, the pair of first gate spacers 150 and 151 may be separated from each other by the first gate electrode 130 in a first direction X. For example, the first gate spacer 150 of the pair of first gate spacers may be provided in parallel with and contacting a first side wall of the first gate electrode 130 and the first gate spacer 151 of the pair of first gate spacers may be provided in parallel with and contacting a second side wall, opposite to the first side wall, of the first gate electrode 130.

In some embodiments, the third and fourth gate structures 201 and 202 may each include a second gate insulating layer 210, a second gate electrode 230, a second capping pattern 260, and a pair of second gate spacers 250 and 251. In some embodiments, the pair of second gate spacers 250 and 251 may be separated from each other by the second gate electrode 230 in the direction X. For example, the second gate spacer 250 of the pair of second gate spacers may be provided in parallel with and contacting a first side wall of the second gate electrode 230 and the second gate spacer 251 of the pair of the second gate spacers may be provided in parallel with and contacting a second side wall, opposite to the first side wall, of the second gate electrode 230.

Figure 7:
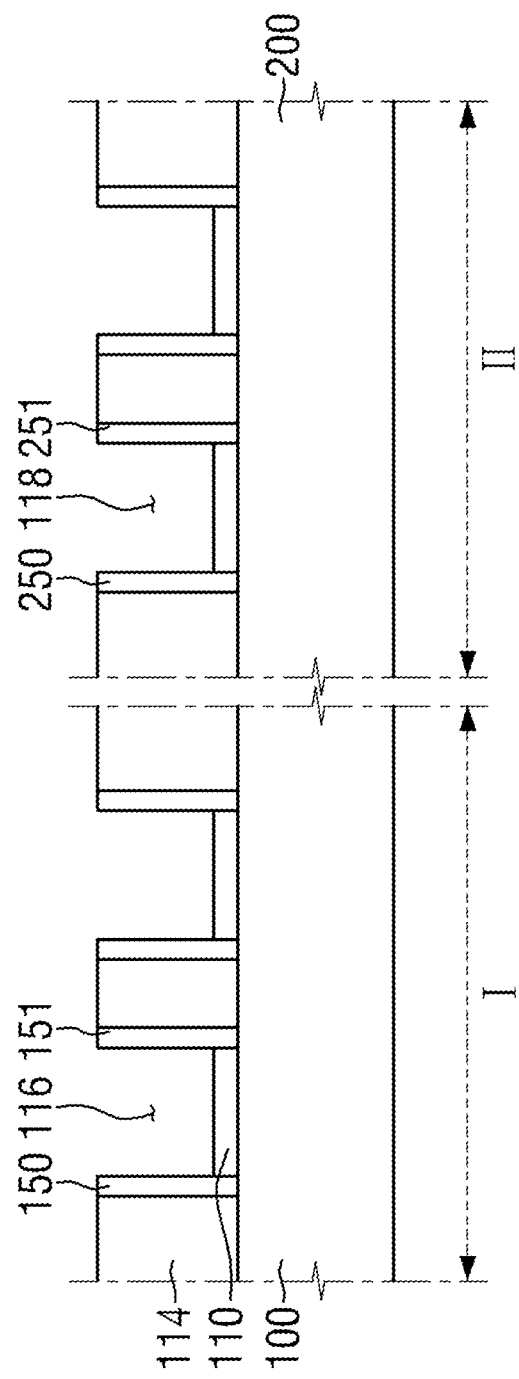

In some embodiments, a first trench 116 may be defined by first gate spacers 150 and 151, with the first gate insulating layer 110, the first gate electrode 130, and the first capping pattern 160 successively laminated on the substrate 100. The first and second gate structures 101 and 102 may extend in a second direction Y. In some embodiments, a second trench 118 (e.g., as shown in FIG. 7) may be defined by the pair of second gate spacers 250 and 251, with the second gate insulating layer 210, the second gate electrode 230, and the second capping pattern 260 successively laminated on the substrate 200. The third and fourth gate structures 201 and 202 may extend in the second direction Y.

In certain embodiments, the substrates 100 and 200 may be made of a bulk silicon. In other embodiments, the substrates 100 and 200 may be made of an SOI (Silicon-On-Insulator). The use of an SOI substrate in place of a bulk silicon substrate in a semiconductor device manufacturing process described herein may provide improved device performance by reducing parasitic device capacitance. In exemplary embodiments, the substrates 100 and 200 may include silicon substrates, or may include another material, for example, germanium, silicon germanium, indium antimonide, lead telluride, indium arsenide, indium phosphide, gallium arsenide, or gallium antimonide, but are not limited thereto.

In some embodiments, the first gate spacers 150, 151 may include, for example, a low-k material (e.g., a material having a lower dielectric constant relative to a silicon oxide layer). The low-k material included in the first gate spacers 150, 151 may reduce the occurrence of parasitic capacitance between a first contact 120 and the first gate structure 101.

In a semiconductor device according to some embodiments of the present disclosure, the first gate spacer 150 may define a side wall of the first contact 120 that is formed through, for example, a SAC (Self Aligned Contact) process.

Figure 9:
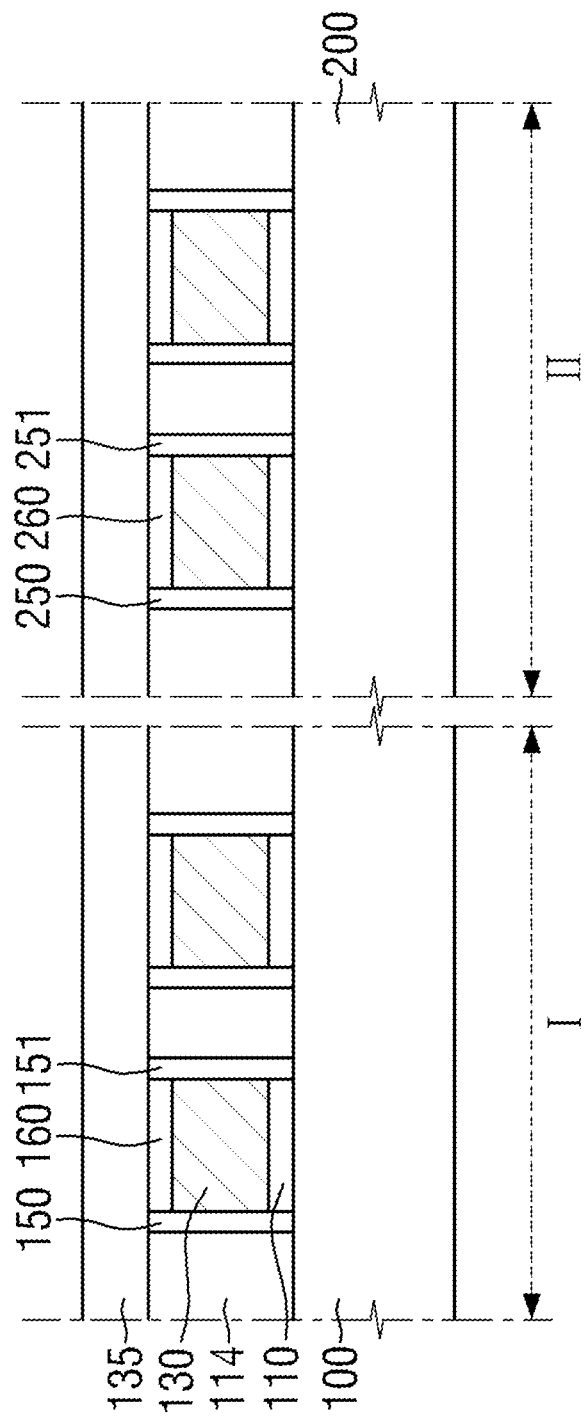

The first contact 120 may be formed through the SAC process, and the first gate spacers 150, 151 may include a material having etch selectivity lower than that of a first interlayer insulating layer 114 (shown, e.g., FIG. 6) and that of a second interlayer insulating layer 135 (shown, e.g., in FIG. 9). Because of this lower etch selectivity, the first gate spacers 150, 151 may etch at a lower rate (in a subsequent process) as compared to the first interlayer insulating layer 114 and the second interlayer insulating layer 135.

In some embodiments, the first gate spacer 150 may define a first side wall of the first trench 116, and the first gate spacer 151 may define a second side wall, opposite to the first side wall of the first trench 116, and the substrate 100 may define a bottom surface of the first trench 116.

The semiconductor device 1 may include a third interlayer insulating layer 180 on the first gate structure 101 according to some embodiments. The first contact 120 may be formed, in certain embodiments, to penetrate the third interlayer insulating layer 180.

As an example, the first gate insulating layer 110 may be formed on the bottom surface of the first trench 116. The first gate insulating layer 110 may include a high-k dielectric layer, such as one having a dielectric constant greater than 8, greater than 10, or having a dielectric constant greater than a silicon oxide layer. The high-k dielectric layer may include, for example, at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but is not limited to the example given above.

The first gate electrode 130 may include, for example, a conductive material. Examples of such a conductive material may include, for example, doped polysilicon, titanium nitride (TiN), tantalum nitride (TaN), tungsten nitride (WN), titanium (Ti), tantalum (Ta), and tungsten (W), but are not limited the example given above.

In some embodiments, the first contact 120 may be formed on the substrate 100 to overlap the first gate spacer 150. For example, the first contact 120 may be formed to fill a space that is defined by an upper surface of the substrate 100, a side wall of the first gate spacer 150, and a side wall of the third interlayer insulating layer 180.

The first contact 120 may include, for example, at least one of aluminum (Al), tungsten (W), and copper (Cu), but is not limited this example.

In some embodiments, a first partial layer 140 may be formed on the first gate spacers 150, 151 and the first capping pattern 160. For example, the first partial layer 140 may be formed adjacent to a side wall of the first contact 120. The first partial layer 140 may include discrete portions that extend between sidewalls of neighboring contacts 120 and may be formed to fully cover the first capping pattern 160 and to cover all or cover significant portions of the tops of the first gate spacers 150, 151. The first contacts may be defined by the first partial layer 140 together with the third interlayer insulating layer 180 and the first gate spacers 150, 151.

Figure 6:
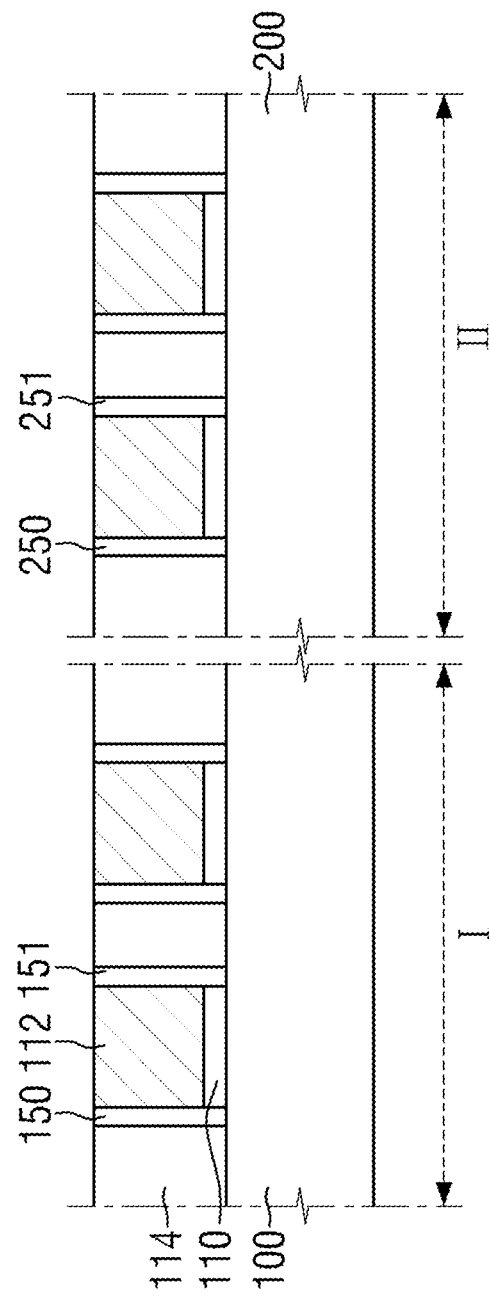
FIGS. 6 to 12 are views of intermediate steps explaining a method for fabricating a semiconductor device according to an embodiment of the present disclosure.

When the first gate spacers 150, 151 include a low-k material, their etch selectivity may not be sufficiently high in relation to a first interlayer insulating layer 114 (in FIG. 6). As a result, in etching the first interlayer insulating layer 114 (in FIG. 6) to form the first contact 120, the first gate spacers 150, 151 may also be etched. Thus, a short circuit may occur between the first gate electrode 130 and the first contact 120.

As an example, the first partial layer 140 may be formed on the first gate spacers 150, 151 which may prevent the first gate spacers 150, 151 from being etched together with the first interlayer insulating layer 114 (in FIG. 6). The first partial layer 140 will be described later in relation to the function of preventing the first gate spacers 150, 151 from being etched.

The second transistor 11 may include a second partial layer 240, and the shape of the second partial layer 240 may be different, in some embodiments, from the shape of the first partial layer 140. For example, the shape of both side walls 241 and 242 of the second partial layer 240 may be different from the shape of both side walls of the first partial layer 140. Specifically, a tilt of the first side wall 241 of the second partial layer 240 may be lower than a tilt of the side wall of the first partial layer 140. For example, the downward slope of the external face of the side wall of the first partial layer 140 may be steeper than the downward slope of the external face of the first side wall of the second partial layer 240. Further, the second side wall 242 of the second partial layer 240 may be, for example, in a chamfered or beveled shape. The forming of the both side walls 241 and 242 of the second partial layer 240 will be described later.

In some embodiments, the first capping pattern 160 may be formed on a remaining portion of the first trench 116 that is filled with the first gate electrode 130. For example, the first capping pattern 160 may be formed in the first trench 116 to fill an upper portion of the first trench 116. The upper surface of the first capping pattern 160 may be formed at the same level as the level of the uppermost surface of the first gate spacers 150, 151.

The first capping pattern 160 may include a material having etch selectivity lower than that of the first interlayer insulating layer 114 (in FIG. 6). The first capping pattern 160 may include, for example, silicon nitride or silicon oxynitride.

Figure 3:
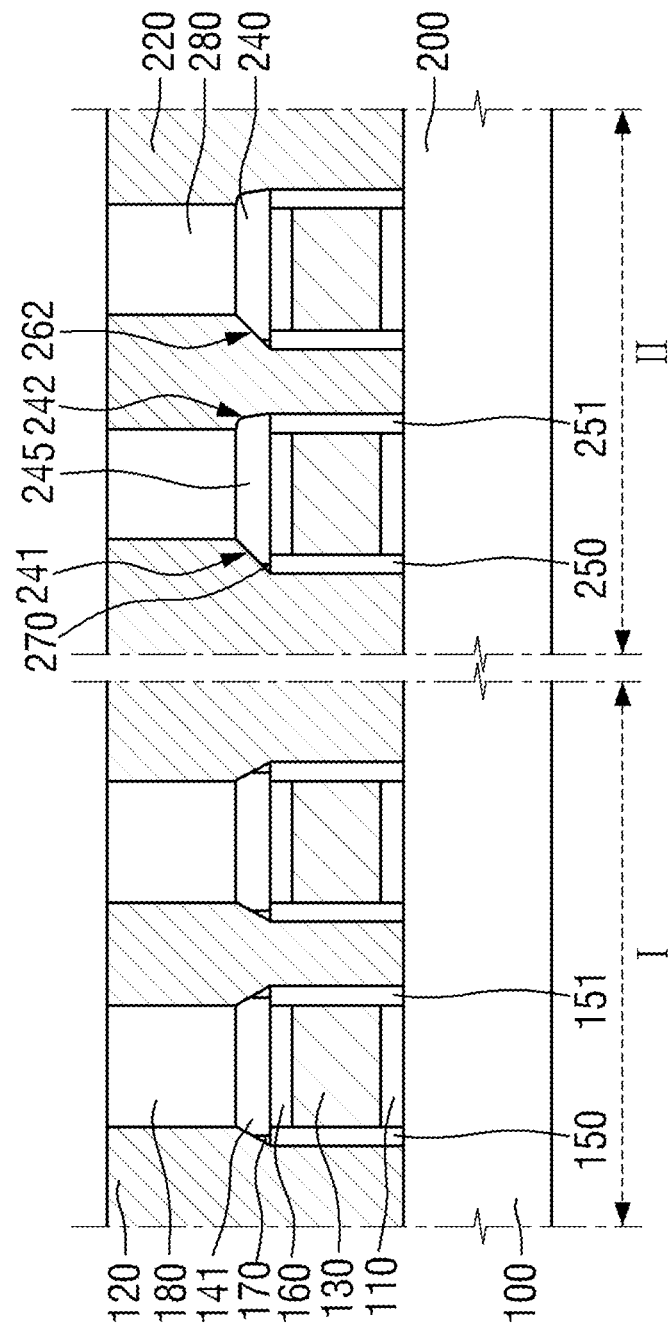
FIG. 3 is a cross-sectional view of a semiconductor device according to another embodiment of the present disclosure.

FIG. 3 is a cross-sectional view of a semiconductor device according to exemplary embodiments of the present disclosure. Hereinafter, duplicate explanation of the same contents according to the embodiments as described above will be omitted, and explanation will be made around different points between the embodiments.

Referring to FIG. 3, a semiconductor device 2 may have a third partial layer 141 and a fourth partial layer 245, the shape of which is different from that according to the above-described embodiments.

For example, a passivation layer 170 may be formed on an upper surface of the first gate spacer 150 to be adjacent to both side walls of the third partial layer 141. In this embodiment, the passivation layer 170 may prevent the etching of the first gate spacers 150, 151. In an exemplary embodiment, the passivation layer 170 may include a by-product that occurs in the process of etching the third partial layer 141. For example, the passivation layer 170 may include a carbon polymer.

In some embodiments, a passivation layer 270 may be formed on the first side wall 241 of the fourth partial layer 245, but not on the second side wall 242 of the fourth partial layer 245. The forming of the passivation layers 170 and 270 will be described later.

Figure 4:
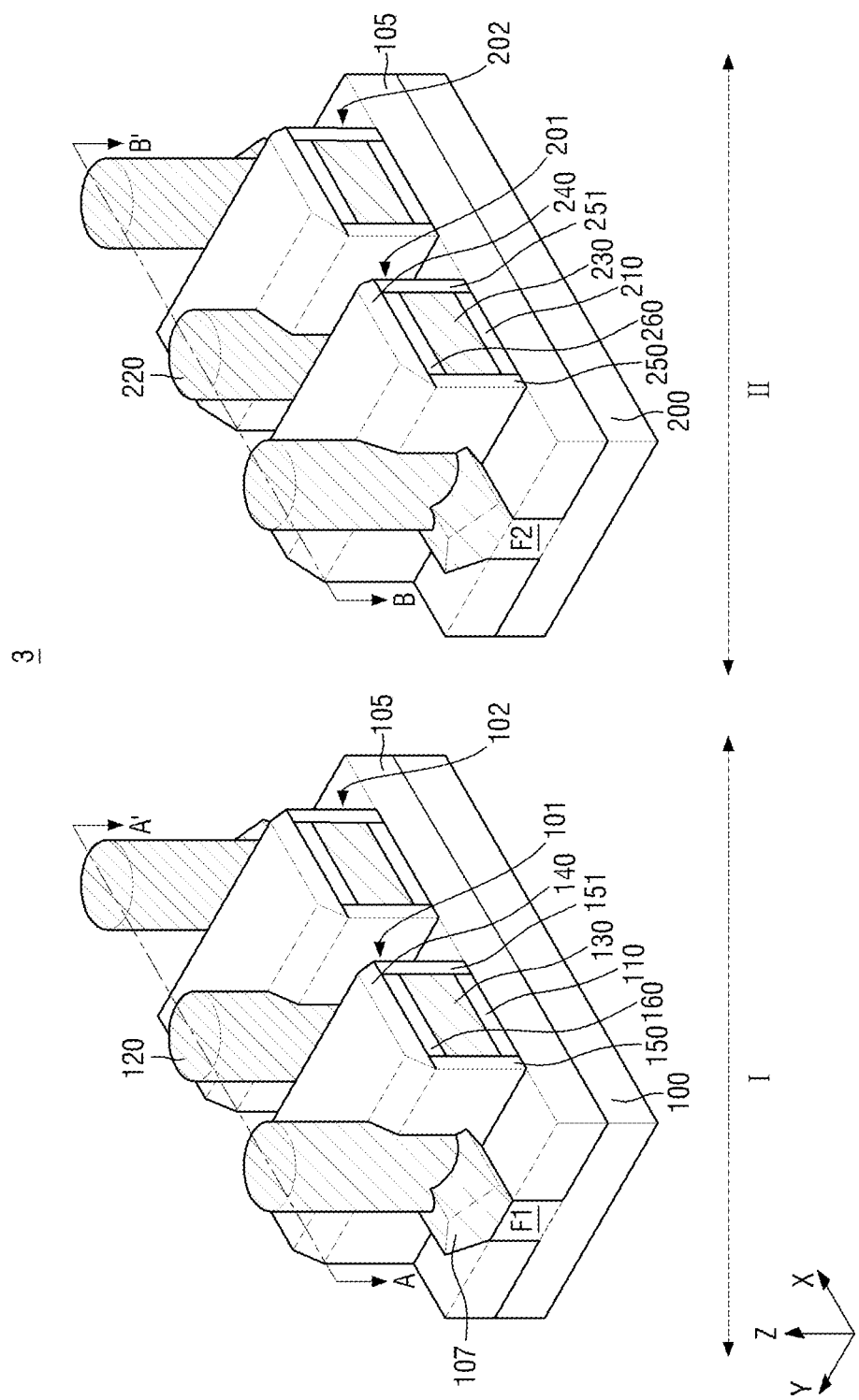
FIG. 4 is a perspective view of a semiconductor device according to still another embodiment of the present disclosure.
Figure 5:
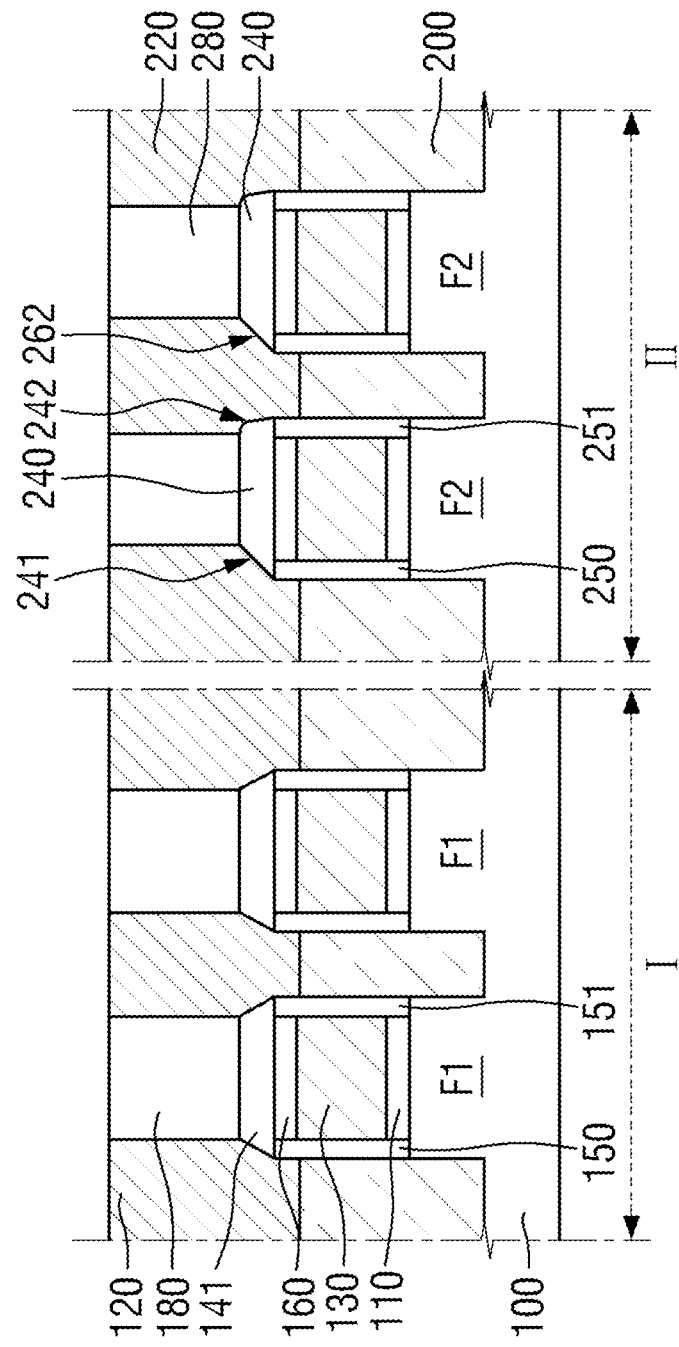
FIG. 5 is a cross-sectional view taken along lines A-A' and B-B' of FIG. 4.

FIG. 4 is a perspective view of a semiconductor device according exemplary embodiments of the present disclosure, and FIG. 5 is a cross-sectional view taken along lines A-A' and B-B' of FIG. 4. In the same manner as described above, duplicate explanation of the same contents according to the embodiments as described above will be omitted, and explanation will be made around different points between the embodiments.

Referring to FIGS. 4 and 5, a semiconductor device 3 may include a first fin active pattern 101 that may cross the first gate structure 101 and a second fin active pattern F2 that may cross the second gate structure 102.

In some embodiments, the first and second fin active patterns F1 and F2 may project from the substrates 100 and 200, respectively. For example, a field insulating layer 105 may be formed on the substrate 100 may cover a part of side walls of the first and second fin active patterns F1 and F2. In some embodiments, the first and second fin active patterns F1 and F2 may project from the upper surface of the field insulating layer 105 formed on the substrates 100 and 200.

In some embodiments, the first and second fin active patterns F1 and F2 may extend in the first direction X. The first and second fin active patterns F1 and F2 may, for example, be parts of the substrates 100 and 200, and may include an epitaxial layer that is grown using the substrates 100 and 200 as seed layers.

The first and second fin active patterns F1 and F2 may include, for example, silicon or germanium that is an elemental semiconductor material. Further, the first and second fin active patterns F1 and F2 may include compound semiconductor, and for example, may include group IV-IV compound semiconductor or group III-V compound semiconductor. Specifically, according to the group IV-IV compound semiconductor, the first and second fin active patterns F1 and F2 may be made of a binary compound including at least two of carbon (C), silicon (Si), germanium (Ge), and tin (Sn), a ternary compound, or a compound including the above-described elements doped with group IV elements. According to the group III-V compound semiconductor, the first and second fin active patterns F1 and F2 may be made of, for example, a binary compound formed through combination of at least one of group III elements, such as aluminum (Al), gallium (Ga), and indium (In), and one of group V elements, such as phosphorus (P), arsenide (As), and antimonium (Sb), a ternary compound, or a quaternary compound.

In some embodiments, the first gate spacer 150 may be formed on the first fin active pattern F1 that projects from the field insulating layer 105 and the second gate spacer 250 may be formed on the second fin active pattern F2 that projects from the field insulating layer 105. The first gate spacer 150 may be formed on the first active pattern F1 and may extend in the second direction Y to cross the first fin active pattern F1 and second gate spacer 250 may be formed on the second fin active pattern F2 and may extend in the second direction Y to cross the second fin active pattern F2.

In some embodiments, an elevated source/drain 107 may be formed adjacent to an outer wall of the first gate spacer 150. The elevated source/drain 107 may, for example, come in contact with the outer wall of the first gate spacer 150.

As illustrated in FIG. 4, in some embodiments, the elevated source/drain 107 may be, for example, in a pentagonal shape, but is not limited to this structure. In the elevated source/drain 107 may be, for example, in the shape of a diamond, a circle, or a rectangle.

In some embodiments, the semiconductor device 3 may be a PMOS transistor and the elevated source/drain 107 may include a compression stress material. For example, the compression stress material may be a material having higher lattice constant than the lattice constant of Si, and for example, SiGe. The compression stress material may apply compression stress to the first and second fin active patterns F1 and F2, that is, a channel region, on lower portions of the first and second gate structures 101 and 102 to improve mobility of carriers of the channel region.

In some embodiments, the semiconductor device 3 may be an NMOS transistor and the elevated source/drain 107 may include the same material as the material of the substrates 100 and 200 or a tension stress material. For example, if the substrates 100 and 200 are Si, the elevated source/drain 107 may be Si, or a material (e.g., SiC or SiP)) having lower lattice constant than the lattice constant of Si. The tension stress material may apply tension stress to the first and second fin active patterns F1 and F2, e.g., the channel region, on lower portions of the first and second gate structures 101 and 102 to improve mobility of carriers of the channel region.

FIGS. 6 to 12 are views of intermediate steps explaining a method for fabricating a semiconductor device according to example embodiments.

Referring to FIG. 6, a first gate insulating layer 110 may be formed on the substrate 100 after forming a dummy gate electrode 112 on the substrate 100. The first gate insulating layer 110 and the dummy gate electrode 112 may be successively laminated on the substrate 100.

The first gate insulating layer 110 may include a high-k material. The dummy gate electrode 112 may be made of, for example, silicon, and specifically, may include one of polycrystalline silicon (poly Si), amorphous silicon (a-Si), and a combination thereof. In some embodiments, the dummy gate electrode 112 may not be doped with an impurity. In other embodiments, the dummy gate electrode 112 may be doped with an impurity. The first gate spacers 150, 151 and the second gate spacers 250, 251 may be formed on side walls of a laminated structure that includes the first gate insulating layer 110 and the dummy gate electrode 112.

In some embodiments, on the substrates 100 and 200, a first interlayer insulating layer 114 that covers the dummy gate electrode 112 and the first gate spacers 150, 151 is formed. Par Through planarization of the first interlayer insulating layer 114, the first gate spacers 150, 151 and second gate spacers 250, 251 and an upper surface of the dummy gate electrode 112 are exposed. The planarization may be performed using, for example, a CMP (Chemical Mechanical Polishing) process.

Referring to FIG. 7, in an exemplary embodiment, the dummy gate electrode 112 is removed to form a first trench 116 that is defined by the first gate spacers 150, 151 on the substrate 100 and a second trench 118 that is defined by the second gate spacers 250, 251 on the substrate 200. In this exemplary process, the upper surface of the first gate insulating layer 110 is exposed.

The dummy gate electrode 112 may be removed using a wet etching process in one embodiment or a dry etching process in another embodiment.

Figure 8:
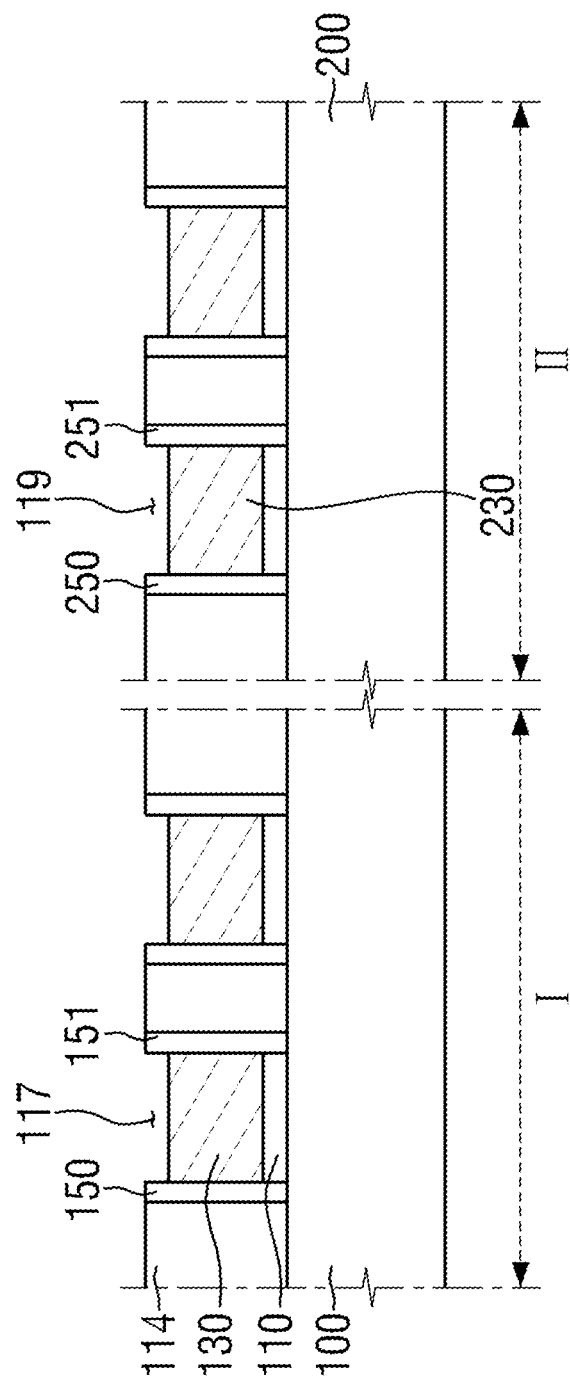

Referring to FIGS. 7 and 8, in an exemplary embodiment, a first gate electrode 130 may be formed in the first trench 116, and a second gate electrode 230 may be formed in the second trench 118. The first gate electrode 130 and the second gate electrode 230 may be formed on the first gate insulating layer 110. In some embodiments, the first gate electrode 130 may fill parts of the first trench 116, and may cover parts of side walls of the first trench 116. In some embodiments, the second gate electrode 230 may fill parts of the second trench 118, and may cover parts of side walls of the second trench 118.

As illustrated in FIG. 8, in some embodiments, the first and second gate structures 101 and 102 may be formed of a single structure of the first and second gate electrodes 130 and 230, but are not limited thereto. For example, the first and second gate electrodes 130 and 230 may be formed through lamination of two or more metal layers. In an exemplary embodiment, the first and second gate electrodes 130 and 230 may include a work function adjustment metal layer and a metal layer that fills a space that is formed by the work function adjustment metal layer.

In some embodiments, in remaining portions of the first trench 116 that is partially filled with first gate electrode 130, a third trench 117 may be formed and in remaining portions of the second trench 118 that is partially filled with the second gate electrode 230, a fourth trench 119 may be formed.

Referring to FIG. 9, in some embodiments, a first capping pattern 160 that fills the third trench 117 may be formed on the first gate electrode 130, and a second capping pattern 260 that fills the fourth trench 119 may be formed on the second gate electrode 230.

In an exemplary embodiment, the first capping pattern 160 may be formed to coincide with the uppermost surface of the first interlayer insulating layer 114.

According to an example embodiment, the first capping pattern 160 may be formed by the following processes. Forming an upper layer (not illustrated) that fills the remaining portions of the first and second trenches 116 and 118. In this exemplary embodiment, the upper layer (not illustrated) covers the upper surface of the first interlayer insulating layer 114. Removing the upper layer (not illustrated) that is formed on the upper surface of the first interlayer insulating layer 114. The removal of the upper layer (not illustrated) may be performed, for example, by a CMP method.

In some embodiments, a second interlayer insulating layer 135 may be formed to cover the first interlayer insulating layer 114, the first capping pattern 160, and the first gate spacers 150, 151 and the second gate spacers 250, 251. As illustrated in FIG. 9, according to example embodiments, the first capping pattern 160 and the second interlayer insulating layer 135 may be formed by separate processes, but are not limited thereto. The second insulating layer 135, like the first capping pattern 160, may include a material having etch selectivity lower than that of the first interlayer insulating layer 114 (in FIG. 6). The second insulating layer 135 and the first capping pattern 160 may include a material having etch selectivity lower than that of the third interlayer insulating layer 180 (in FIG. 10).

For example, the first capping pattern 160 and the second interlayer insulating layer 135 may be simultaneously formed. The second interlayer insulating layer 135 may be formed by forming of a capping layer (not illustrated) with the same height as the second interlayer insulating layer 135 without a separate process for removing the capping layer (not illustrated). In this embodiment, the first capping pattern 160 and the second interlayer insulating layer 135 may include the same material.

In an exemplary embodiment, the second interlayer insulating layer 135 may be formed by depositing SiN onto the first capping pattern 160 and the first interlayer insulating layer 114. In another embodiment, the second interlayer insulating layer 135 may be formed by depositing SiOCN onto the first capping pattern 160 and the first interlayer insulating layer 114. In some examples, the first capping pattern 160 and the second interlayer insulating layer 135 may formed of different materials (e.g., one of 160 and 135 may be SiN and the other of 160 an 135 may be SiOCN).

Figure 10:
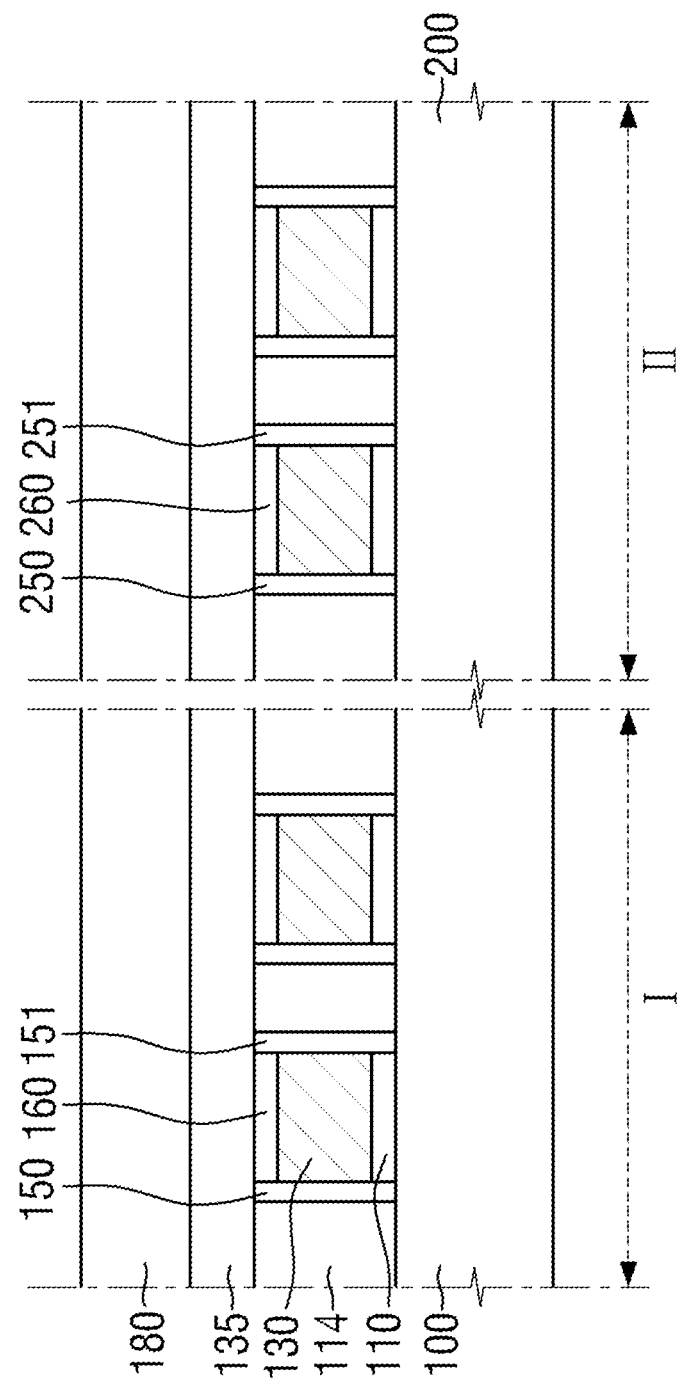

Referring to FIG. 10, a third interlayer insulating layer 180 is formed on the second interlayer insulating layer 135. The third interlayer insulating layer 180 may include, for example, the same material as the first interlayer insulating layer 114, but is not limited thereto. The third interlayer insulating layer 180 may include, for example, silicon oxide ($SiO_2$).

Figure 11:
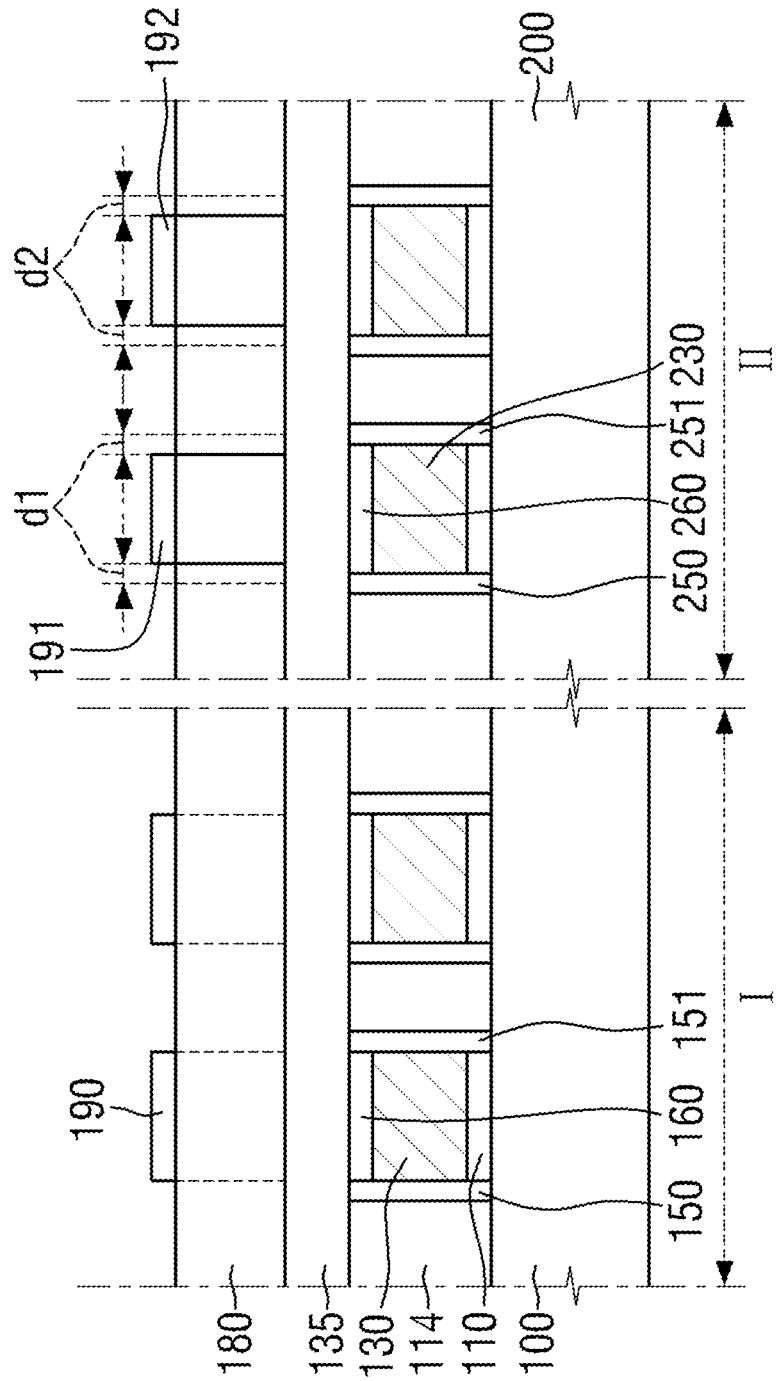

Referring to FIG. 11, first mask layer pattern 190 and second mask layer pattern 191 may be formed on the third interlayer insulating layer 180, and an exposure process may be performed with respect to the third interlayer insulating layer 180.

In example embodiments, the first mask layer pattern 190 may be formed to vertically overlap the first capping pattern 160. For example, in order to form a contact hole in a subsequent process, the third interlayer insulating layer 180 is etched except for the third interlayer insulating layer 180 that overlaps the first mask layer pattern 190. Further, the first mask layer pattern 190 may be correctly aligned with the first capping pattern 160.

In contrast, the second mask layer pattern 191 may be arranged with a difference of a first length d1 with respect to the second capping pattern 260. For example, the second mask layer pattern 191 may be misaligned to the extent of the first length d1 with respect to the second capping pattern 260.

Further, a third mask layer pattern 192 may be arranged with a difference of a second length d2 with respect to a third capping pattern 261. In this example, the first length d1 and the second length d2 may be equal to each other.

In the case of etching the third interlayer insulating layer 180 in a state where the second and third mask layer patterns 191 and 192 are misaligned from each other, upper surfaces of the second and third gate spacers 250 and 251 may be exposed. Accordingly, in the process of etching the first interlayer insulating layer 114, one or both of the second and third gate spacers 250 and 251 may be etched, and the side wall of the second gate electrode 230 may be exposed.

If a contact is formed in a state where the side wall of the second gate electrode 230 is exposed, a short circuit may occur between the source/drain and the gate to lower operation reliability of the semiconductor device 1.

Figure 12:
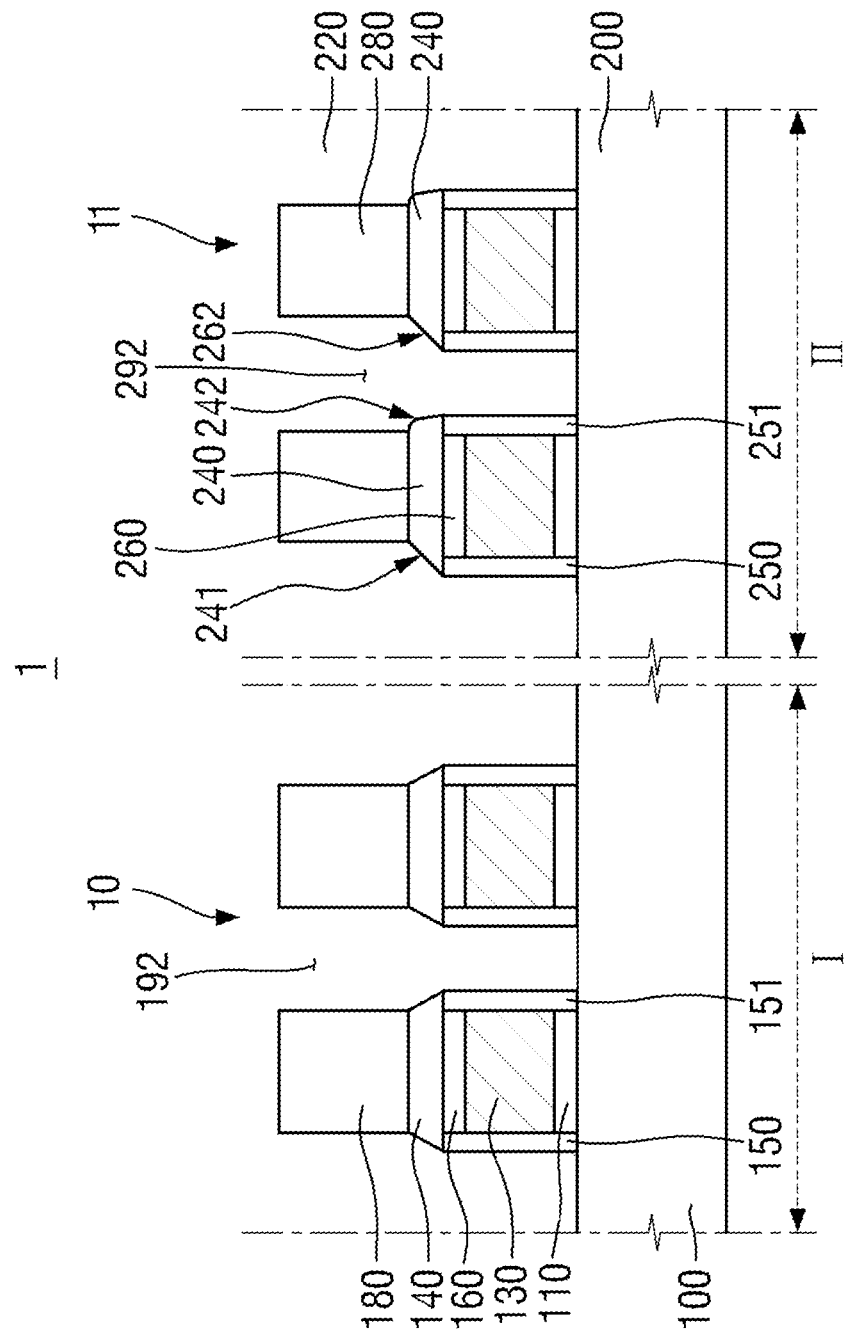

Referring to FIG. 12, a fifth trench is formed in the third interlayer insulating layer 180 using the first mask layer patter 190 and a sixth trench 292 is formed in the third interlayer insulating layer 180 using the second mask layer pattern 191 and the third mask layer pattern 192.

In an exemplary embodiment, the second mask layer pattern 191 and third mask layer pattern 192 are formed to be misaligned from each other. Thus, in this exemplary embodiment, the sixth trench 292 may have a different shape from the shape of the fifth trench 192.

In an exemplary embodiment, the sixth trench 292 is formed in a same manner the fifth trench 192 is formed regardless of the misalignment of the second mask layer pattern 191 and third mask layer pattern 192. Thus, in this exemplary embodiment, the upper surface of the second gate spacer 250 may be exposed. In some embodiments, since the second gate spacer 250 includes a low-k material, the etch selectivity thereof may not be sufficiently high in relation to the first interlayer insulating layer 114. Accordingly, during etching of the first interlayer insulating layer 114, a part of the second gate spacer 250 may be etched together to expose a side wall of the second gate electrode 230.

In some embodiments, the second partial layer 240 may be formed to cover the upper surfaces of the second gate spacers 250, 251. For example, the misalignment state of the second mask layer pattern 191 and the third mask layer pattern 192 may be measured, and in accordance with the misalignment state, the second partial layer 240 may be formed to cover the upper surfaces of the second gate spacers 250, 251.

In accordance with the measurement, an angle of the second partial layer 240 against the side walls 241, 242, and 262 of the second partial layer 240 of a subsequently made device, the second gate spacers 250, 251, and the upper surface of the second capping pattern 260 may be adjusted so that the second partial layer 240 covers the whole upper surfaces of the second gate spacers 250, 251. For example, the subsequently made device may be formed such that the slope of the external face of the side walls 241, 242, 262 of the subsequent device, e.g., are less steep so that the width of the of the gate spacers 250 and 251 of the subsequent device are made greater than the previous device. The slope of the external face of the side walls 241, 242, 262 may be made greater by lowering a bias power of etching equipment, for example. The etching equipment may comprise a dry etch equipment in which the semiconductor device is placed (e.g., as shown in FIG. 11). The bias power may control the speed of etchant ions that bombard the surface of the semiconductor device, so that lowering the bias power may lower the speed of the etchant ions. Thus, by inspecting a first semiconductor device, if a measurement of the second partial layer is less than a predetermined width, a width of the second partial layer 240 in a second semiconductor device made after the first semiconductor device may be increased by decreasing the bias power of the etching equipment as compared to its bias power used in the same etching step to etch the first semiconductor device. The first and second semiconductor devices may be the same device with the same design. Other than the adjustment of the bias power, the process recipe used to manufacture the first and second semiconductor devices may also be the same (but other process adjustments may also be made in some cases). For example, the above-noted adjustment process may be performed before forming the capping layer.

Accordingly, determination of the width of the lowermost portion of the second partial layer 240 may correspond to the degree of misalignment between the second mask layer pattern 191 and the third mask layer pattern 192.

In an exemplary embodiment, where the second partial layer 240 is formed to cover the whole upper surfaces of the second mask layer pattern and the third mask layer pattern 192, the second gate spacers 250, 251 may be prevented from being etched. Thus, according to this exemplary embodiment, the second gate electrode 230 is not exposed and a short circuit that may occur in the second gate electrode 230 may be prevented, and the operation reliability of the semiconductor device 1 may be improved.

In some embodiments, during etching of the second interlayer insulating layer 135, the etching type of the second interlayer insulating layer 135 may be adjusted through adjustment of a bias power of an etching equipment. The bias power may be, for example, in proportion to a projection speed of ions included in an etching gas. For example, if the bias power of the etching equipment is strong, the projection speed of ions included in the etching solution becomes high, and the angle formed between the side wall of the second partial layer 240 and the upper surfaces of the second gate spacers 250, 251 may become sharp.

In some embodiments, the second side wall 242 of the second partial layer 240 may be, for example, in a chamfered shape. In some embodiments, the second side wall 242 may be formed to overlap not only the upper surface of the second gate spacer 251 but also the first interlayer insulating layer 114. In an exemplary embodiment, during etching of the first interlayer insulating layer 114, a part of the second side wall 242 of the second partial layer 240 may also be etched simultaneously, and thus the second side wall 242 of the second partial layer 240 may be in a chamfered shape.

Referring again to FIG. 2, the first contact 120 is formed by filling a conductive material in a space that is surrounded by the first gate spacers 150, 151, the first partial layer 140, and the third interlayer insulating layer 180. The first contact 120 may be formed as a self aligned contact by the first gate spacers 150, 151, the first partial layer 140, and the third interlayer insulating layer 180.

Figure 13:
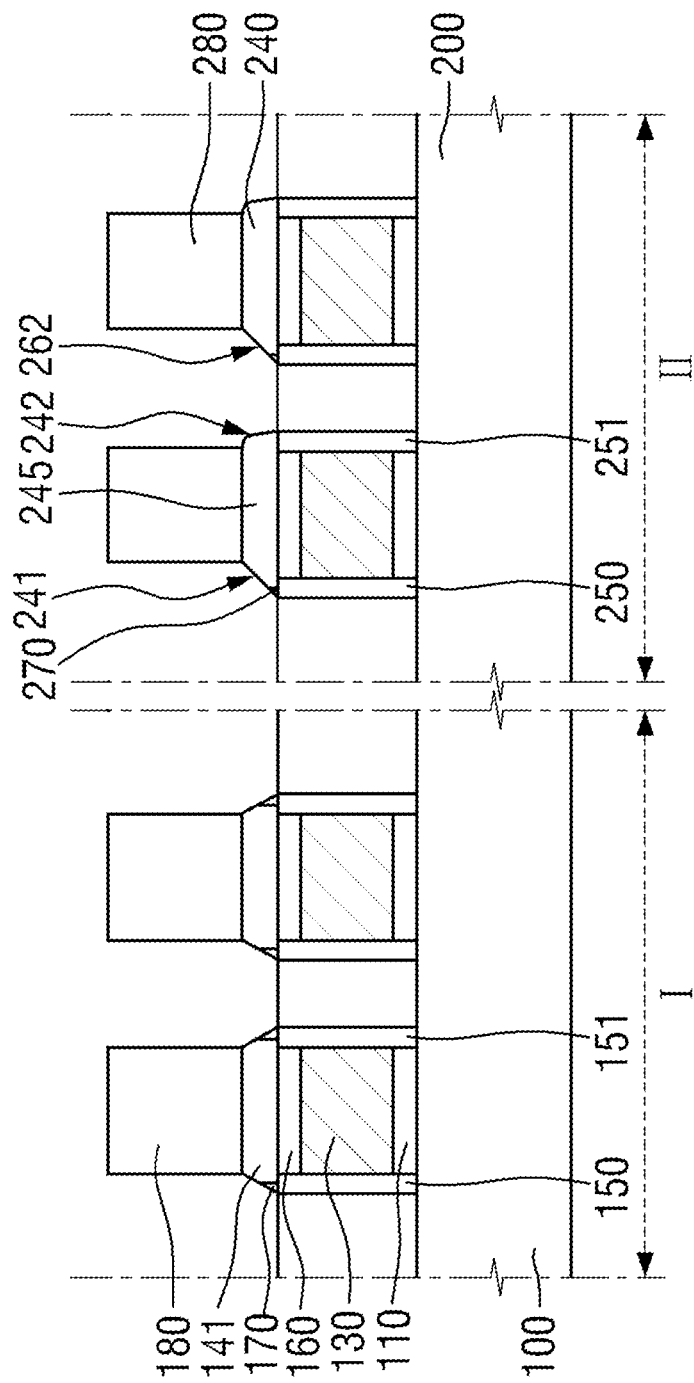
FIG. 13 is a view of an intermediate step explaining a method for fabricating a semiconductor device according to another embodiment of the present disclosure.

FIG. 13 is a view of an intermediate step explaining a method for fabricating a semiconductor device according to another embodiment of the present disclosure.

Referring to FIGS. 3 and 13, according to exemplary embodiments, a shape of a partial layer 141 of the semiconductor device 2 may differ from a shape of the first partial layer 140 (in FIG. 2) according to the above-described embodiments.

According to en exemplary embodiment, during formation of partial layers 141 and 245 (e.g., as shown in FIG. 3) by etching of the second interlayer insulating layer 135, the second interlayer insulating layer 135 may react on the etching gas including $C_4F_6$ to form carbon polymer fragments. For example, carbon polymer fragments may move along the side walls of the partial layer 141 to form the passivation layer 170 and carbon polymer fragments may move along the side walls of the partial layer 245 to form the passivation 270.

In some embodiments, the passivation layers 170 and 270 including carbon polymer may prevent the upper surfaces of the first gate spacers 150, 151 and the second gate spacers 250, 251 from being etched. In an exemplary embodiment, if the upper surfaces of the first gate spacers 150, 151 and the second gate spacers 250, 251 are not being etched, but remained, the operation reliability of the semiconductor device 2, which occurs due to the exposure of the second gate electrode 230, can be prevented from being deteriorated.

Figure 14:
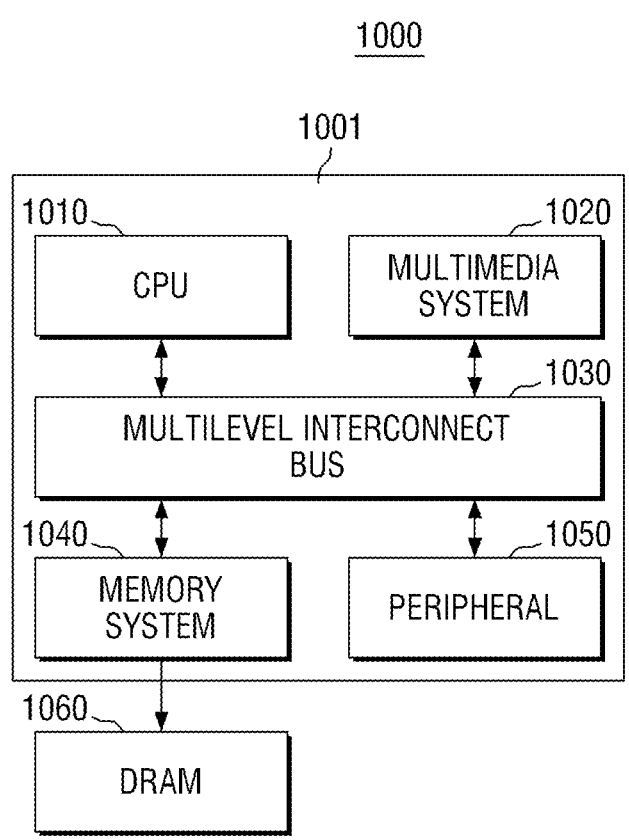
FIG. 14 is a block diagram of a SoC system that includes a semiconductor device fabricated according to embodiments of the present disclosure.

FIG. 14 is a block diagram of a SoC system that may include a semiconductor device according to some embodiments of the present disclosure.

Referring to FIG. 14, a SoC system 1000 may include an application processor 1001 and a dynamic random-access memory (DRAM) 1060.

The application processor 1001 may include a central processing unit (CPU) 1010, a multimedia system 1020, a bus 1030, a memory system 1040, and a peripheral circuit 1050.

The CPU 1010 may perform operations required to drive the SoC system 1000. In some embodiments, the CPU 1010 may include a plurality of cores.

The multimedia system 102 may be used when the SoC system 100 performs various kinds of multimedia functions. The multimedia system 1020 may include, for example, a 3D engine module, a video codec, a display system, a camera system, and a post-processor.

The bus 1030 may be used for exchanging data communication among the CPU 1010, the multimedia system 1020, the memory system 1040, and the peripheral circuit 1050. In some embodiments, the bus 1030 may have a multi-layer structure. Specifically, an example of the bus 1030 may be multi-layer include a multilayer AHB (Advanced High-performance Bus) and a multilayer AXI (Advanced eXtensible Interface), but the present disclosure is not limited to these.

The memory system 1040 may enable the application processor 1001 to connect to an external memory (e.g., DRAM 1060) to perform high-speed operation. In some embodiments of the present disclosure, the memory system 1040 may include a separate controller (e.g., DRAM controller) for controlling the external memory (e.g., DRAM 1060).

The peripheral circuit 1050 may enable the SoC system 1000 to have a seamless connection to an external device (e.g., main board). Accordingly, the peripheral circuit 1050 may be provided with various interfaces for making the external device connected to the SoC system 1000 compatible.

The DRAM 1060 may function as an operating memory that is necessary when the application processor 1001 operates. In some embodiments of the present disclosure, the DRAM 1060 may be arranged on an outside of the application processor 1001 as illustrated in the drawing. Specifically, the DRAM 1060 and the application processor 1001 may be packaged in the form of PoP (Package on Package).

At least one of the constituent elements of the SoC system 1000 may adopt any one of the semiconductor devices according to example embodiments.

Figure 15:
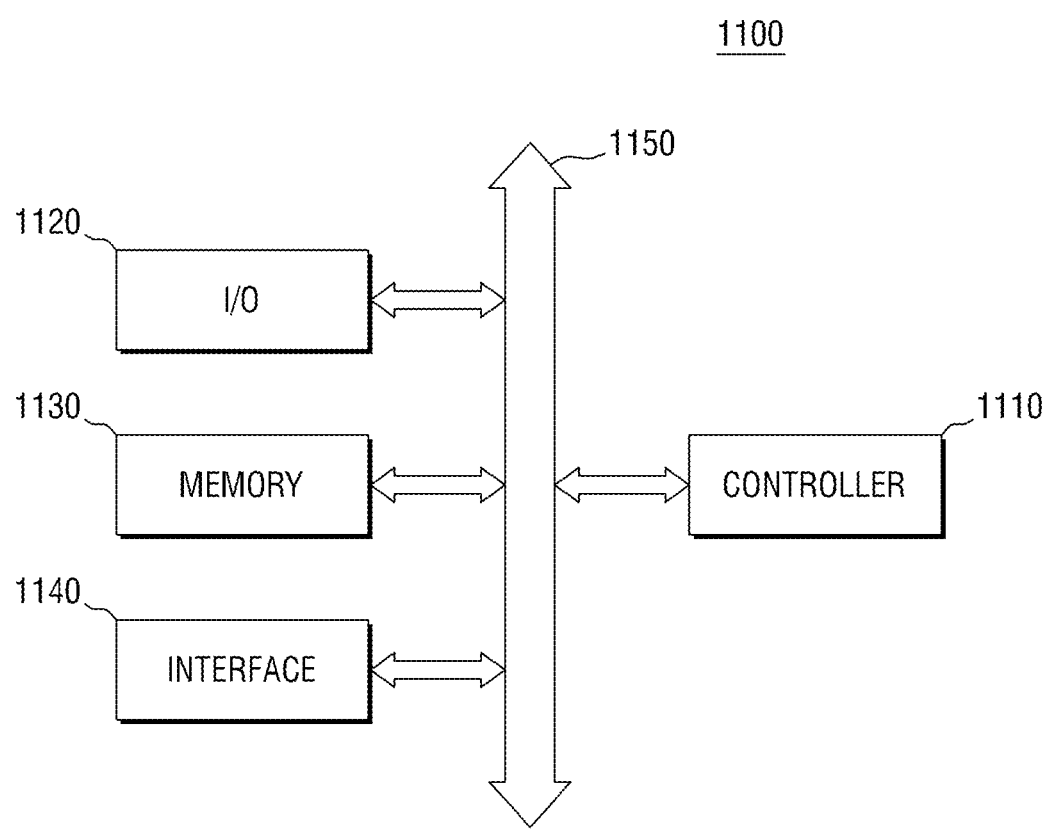
FIG. 15 is a block diagram of an electronic system that includes a semiconductor device fabricated according to embodiments of the present disclosure.

FIG. 15 is a block diagram of an electronic system that may include a semiconductor device according to example embodiments.

Referring to FIG. 15, an electronic system 1100 according to some example embodiments may include a controller 1110, an input/output (I/O) device 1120, a memory device 1130, an interface 1140, and a bus 1150. The controller 1110, the I/O device 1120, the memory device 1130, and/or the interface 1140 may be coupled to one another through the bus 1150. The bus 1150 corresponds to paths through which data is transferred.

The controller 1110 may include at least one of a microprocessor, a digital signal processor, a micro-controller and logic devices capable of performing functions similar to those mentioned above. The I/O device 1120 may include a keypad, a keyboard, and a display device. The memory device 1130 may store data and/or commands. The interface 1140 may function to transfer the data to a communication network or receive the data from the communication network. The interface 1140 may be of a wired or wireless type. For example, the interface 1140 may include an antenna or a wire/wireless transceiver.

Although not illustrated, the electronic system 1100 may further include a high-speed DRAM and/or SRAM as an operating memory for improving the operation of the controller 1110.

According to the embodiments described above, the semiconductor device may be provided in the memory device 1130, or may be provided as a part of the controller 1110 or the I/O device 1120.

The electronic system 1100 may be applied to a PDA (Personal Digital Assistant), a portable computer, a web tablet, a wireless phone, a mobile phone, a digital music player, a memory card, or all electronic devices that can transmit and/or receive information in wireless environments.

Figure 16:
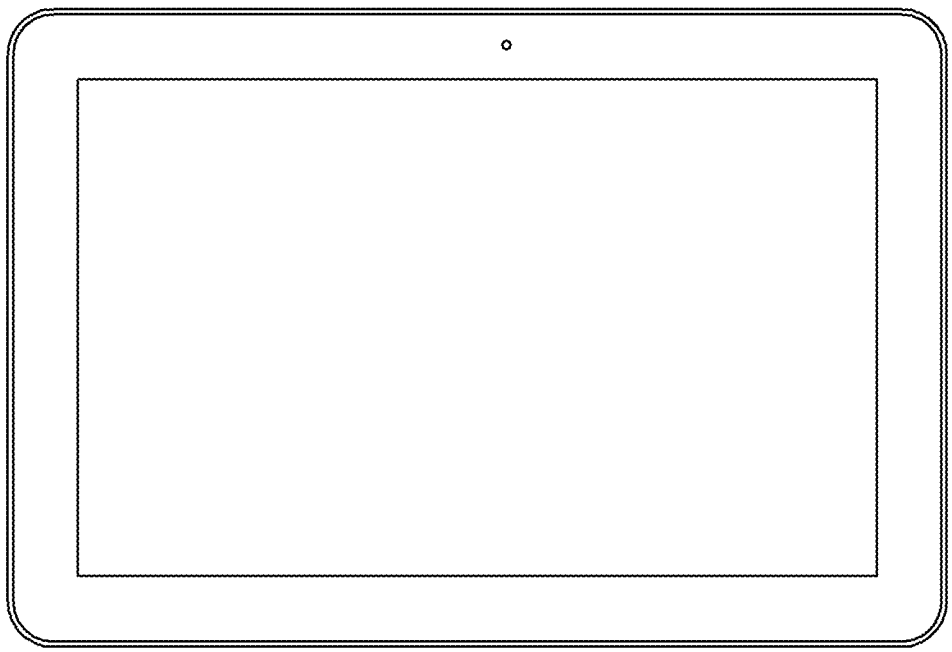
FIGS. 16 to 18 are views of exemplary semiconductor systems to which a semiconductor device according to some embodiments of the present disclosure can be applied.
Figure 17:
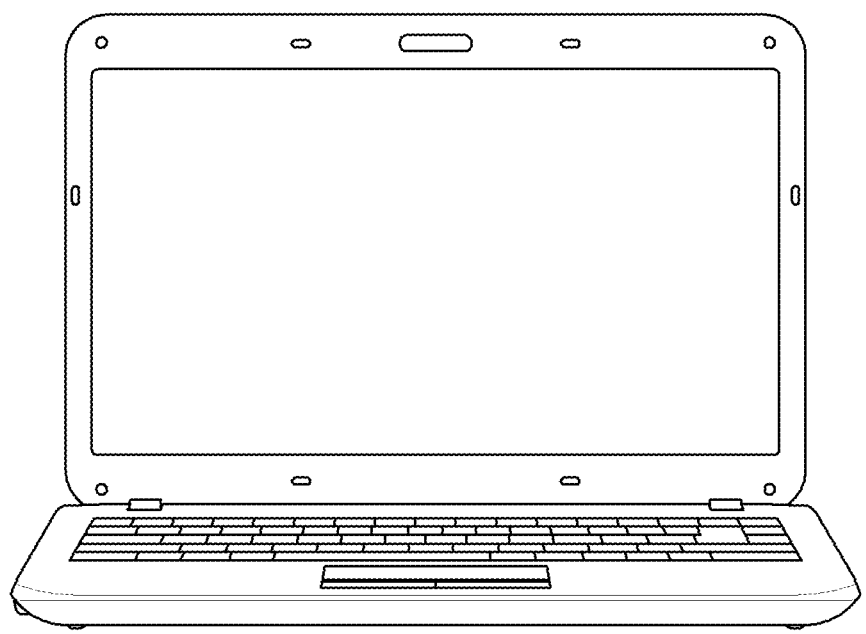
Figure 18:
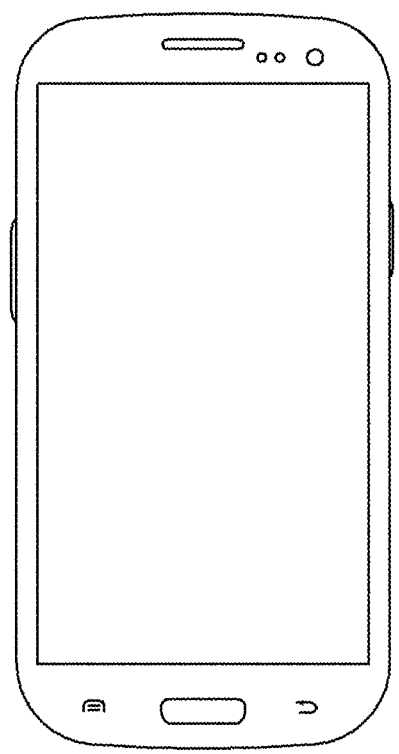

FIGS. 16 to 18 illustrate exemplary semiconductor systems that may include a semiconductor device according to example embodiments.

FIG. 16 illustrates a tablet PC 1200, FIG. 17 illustrates a notebook computer 1300, and FIG. 18 illustrates a smartphone 1400. According to the example embodiments explained above, the semiconductor device may be used in these devices, i.e., in the tablet PC 1200, the notebook computer 1300, or the smartphone 1400.

Further, it is apparent to those of skilled in the art that the semiconductor device fabricated according to the embodiments of the present disclosure can be applied even to other integrated circuit devices that have not been exemplified.

That is, although the tablet PC 1200, the notebook computer 1300, and the smart phone 1400 have been indicated as examples of the semiconductor system according to this embodiment, the examples of the semiconductor system according to this embodiment are not limited thereto.

In some example embodiments, the semiconductor system may be implemented as a computer, UMPC (Ultra Mobile PC), workstation, net-book, PDA (Personal Digital Assistant), portable computer, wireless phone, mobile phone, e-book, PMP (Portable Multimedia Player), portable game machine, navigation device, black box, digital camera, 3D television set, digital audio recorder, digital audio player, digital picture recorder, digital picture player, digital video recorder, or digital video player.

Although preferred embodiments of the present disclosure have been described for illustrative purposes, those skilled in the art will appreciate that various modifications, additions and substitutions are possible, without departing from the scope and spirit of the disclosure as disclosed in the accompanying claims.

The foregoing is illustrative of the present disclosure and is not to be construed as limiting thereof. Although a few embodiments of the present disclosure have been described, those skilled in the art will readily appreciate that many modifications are possible in the embodiments without materially departing from the novel teachings and advantages of the present disclosure. Accordingly, all such modifications are intended to be included within the scope of the present disclosure as defined in the claims. Therefore, it is to be understood that the foregoing is illustrative of the present disclosure and is not to be construed as limited to the specific embodiments disclosed, and that modifications to the disclosed embodiments, as well as other embodiments, are intended to be included within the scope of the appended claims. The present disclosure is defined by the following claims, with equivalents of the claims to be included therein.

What is claimed is:

1. A method for fabricating a semiconductor device, comprising:

forming a first interlayer insulating layer including a first trench that is defined by a plurality of first gate spacers and a second trench that is defined by a plurality of second gate spacers on a substrate;

forming a first gate electrode that fills a part of the first trench and a second gate electrode that fills a part of the second trench;

forming a first capping pattern that fills the remainder of the first trench on the first gate electrode;

forming a second capping pattern that fills the remainder of the second trench on the second gate electrode;

forming a second interlayer insulating layer that covers the first plurality of gate spacers and the second plurality of gate spacers on the first interlayer insulating layer;

forming a third interlayer insulating layer on the second interlayer insulating layer; and forming a contact hole that penetrates the third interlayer insulating layer and the second interlayer insulating layer between the first gate electrode and the second gate electrode, wherein a width in which an upper surface of the first plurality of gate spacers and the second interlayer insulating layer overlap each other is equal to a width in which an upper surface of the second plurality of gate spacers and the second interlayer insulating layer overlap each other.

2. The method of claim 1, wherein the first capping pattern and the second interlayer insulating layer are simultaneously formed.

3. The method of claim 1, wherein the forming the first capping pattern comprises:

forming a capping layer that fills the remainder of the first trench and covers an upper surface of the first interlayer insulating layer; and removing the capping layer that is formed on the upper surface of the first interlayer insulating layer.

4. The method of claim 3, wherein before forming the capping layer, the method further comprises:

performing an exposure process on the third interlayer insulating layer; and measuring misalignment of the exposure process.

5. The method of claim 4, further comprising determining the width of a lowermost portion of the first capping pattern on the basis of a measurede value of the misalignment of the exposure process.

6. The method of claim 5, wherein the determining the width of the lowermost portion of the first capping pattern comprises adjusting a bias power of an etching equipment.

7. The method of claim 1, wherein the forming the contact hole comprises forming a passivation layer that is adjacent to a side wall of the first capping pattern on an upper surfaces of the pair of first gate spacers.

8. The method of claim 7, wherein the passivation layer comprises carbon polymer.

9. The method of claim 1, wherein the first and second gate spacers comprises a low-k material.

10. The method of claim 1, wherein the second interlayer insulating layer comprises any one of SiN and SiOCN.

11. The method of claim 1, wherein a height of uppermost surfaces of the first and second gate spacers is equal to a height of the first interlayer insulating layer.

12. The method of claim 1, wherein an etch selectivity of the plurality of first gate spacers is lower than both of an etch selectivity of the first interlayer insulating layer and an etch selectivity of the second interlayer insulating layer.

13. The method of claim 1, wherein forming of a contact hole comprises:

forming a first mask layer pattern vertically overlapping the first capping pattern;

etching a portion of the third interlayer insulating layer without etching a portion of the third interlayer insulating layer that overlaps the first mask layer pattern; and aligning the first mask layer pattern with the first capping pattern.

14. The method of claim 1, further comprising:

forming a partial layer over an upper surface of the second capping pattern, wherein an angle of the partial layer against side walls of the partial layer and the upper surface of the second capping pattern is adjusted in a manner such that the partial layer covers entire upper surface of the plurality of second gate spacers.

15. A method, comprising:

providing a substrate having a first region and a second region;

forming a first gate spacer and a second gate spacer on the first region of the substrate;

forming a third gate spacer and a fourth gate spacer on the second region of the substrate;

forming a first interlayer insulating layer on the substrate, the first interlayer insulating layer includes:
a first trench defined by the first gate spacer;
a second trench defined by the second gate spacer;
a third trench defined by the third gate spacer; and
a fourth trench defined by the fourth gate spacer;

forming a first gate electrode that fills a part of the first trench;

forming a second gate electrode that fills a part of the second trench;

forming a third gate electrode that fills a part of the third trench;

forming a fourth gate electrode that fills a part of the fourth trench;

forming a first capping pattern that fills the remainder of the first trench on the first gate electrode;

forming a second capping pattern that fills the remainder of the second trench on the second gate electrode;

forming a third capping pattern that fills the remainder of the third trench on the third gate electrode;

forming a fourth capping pattern that fills the remainder of the fourth trench on the fourth gate electrode;

forming a second interlayer insulating layer that covers the first gate spacer, the second gate spacer, the third gate spacer and the fourth gate spacer on the first interlayer insulating layer;

forming a first capping layer on the first gate spacer and the second gate spacer by etching the second interlayer insulating layer; and forming a second capping layer on the third gate spacer and the fourth gate spacer by etching of the second interlayer insulating layer, wherein a width in which an upper surface of the first gate spacer and the first capping layer overlap each other is different from a width in which an upper surface of the third gate spacer and the second capping layer overlap each other.

16. The method of claim 15, wherein the forming the first capping layer includes forming a first contact hole between the first gate electrode and the second gate electrode, and the forming the second capping layer includes forming a second contact hole between the third gate electrode and the fourth gate electrode.

17. The method of claim 15, wherein the first capping layer and the second capping layer are formed with different bias powers.

18. A method of manufacturing a semiconductor device, comprising:

forming a first interlayer insulating layer including a first trench that is defined by a plurality of first gate spacers on a substrate;

forming a first gate electrode that fills a part of the first trench;

forming a first capping pattern that fills the remainder of the first trench;

forming a second interlayer insulating layer that covers the first plurality of gate spacers on the first interlayer insulating layer;

forming a third interlayer insulating layer on the second interlayer insulating layer; and forming a contact hole by etching through the third interlayer insulating layer and the second interlayer insulating layer, wherein an etch selectivity of the second interlayer insulating layer is lower than both of an etch selectivity of the first interlayer insulating layer and an etch selectivity of the third interlayer insulating layer, wherein a width in which an upper surface of the first plurality of gate spacers and the second interlayer insulating layer overlap each other is equal to a width in which an upper surface of the second plurality of gate spacers and the second interlayer insulating layer overlap each other.

19. The method of claim 18, wherein the first interlayer insulating layer includes a second trench that is defined by a plurality of second gate spacers, and the method further comprises:

forming a second gate electrode that fills a part of the second trench; and forming a second capping pattern that fills the remainder of the second trench on the second gate electrode, wherein forming the second interlayer insulating layer covers the second plurality of gate spacers on the first interlayer insulating layer, wherein the contact hole is formed between the first gate electrode and the second gate electrode, and wherein an etch selectivity of the plurality of first gate spacers and the plurality of second gate spacers is lower than both of an etch selectivity of the first interlayer insulating layer and an etch selectivity of the third interlayer insulating layer.

* * * * *